United States Patent
Domingo De La Torre Martín et al.

(10) Patent No.: US 12,291,146 B2
(45) Date of Patent: May 6, 2025

(54) VEHICLE TRIM PANEL HAVING A SWITCHING FUNCTION

(71) Applicant: GRUPO ANTOLÍN-INGENIERÍA, S. A., Burgos (ES)

(72) Inventors: Rodrigo Domingo De La Torre Martín, Burgos (ES); Demetrio Galindez Olascoaga, Bamberg (DE)

(73) Assignee: GRUPO ANTOLÍN-INGENIERÍA, S. A., Burgos (ES)

( * ) Notice: Subject to any disclaimer, the term of this patent is extended or adjusted under 35 U.S.C. 154(b) by 263 days.

(21) Appl. No.: 17/895,930

(22) Filed: Aug. 25, 2022

(65) Prior Publication Data

US 2023/0145906 A1    May 11, 2023

(51) Int. Cl.
*B60Q 3/82* (2017.01)
*B60Q 3/233* (2017.01)
*B60R 13/02* (2006.01)

(52) U.S. Cl.
CPC .............. *B60Q 3/82* (2017.02); *B60Q 3/233* (2017.02); *B60R 13/0237* (2013.01); *B60R 2013/0287* (2013.01)

(58) Field of Classification Search
CPC ...... B60Q 3/233; B60Q 3/82; B60R 13/0237; B60R 2013/0287
See application file for complete search history.

(56) References Cited

U.S. PATENT DOCUMENTS

| | | | |
|---|---|---|---|
| 2009/0065336 A1* | 3/2009 | Bayley | B60K 35/10 200/313 |
| 2011/0198995 A1* | 8/2011 | Salter | B60Q 3/82 315/51 |
| 2020/0189457 A1* | 6/2020 | Bachmeier | B60Q 3/62 |

* cited by examiner

*Primary Examiner* — Thomas M Sember
(74) *Attorney, Agent, or Firm* — Banner & Witcoff, Ltd.

(57) ABSTRACT

Vehicle trim panel having a switching function comprising a decorative front panel which conceals a switching device having switching areas defined on the decorative front panel for controlling vehicle functions and a lighting device for backlighting said switching areas. Particularly the switching device comprises a sensor foil comprising a light transmitting film wherein several independent sensing areas are configured and an elastic rubber-like portion configured to be compressed between the back side of the decorative front panel and the front side of the light guide in order to keep the sensor foil in tight contact free of air-gaps with the back side of the decorative front panel. The elastic rubber-like portion comprises first attaching means to tightly and removably attach the sensor foil to either the light guide or to the decorative front panel.

15 Claims, 4 Drawing Sheets

VEHICLE TRIM PANEL HAVING A SWITCHING FUNCTION

CROSS REFERENCE TO RELATED APPLICATIONS

This application claims priority to EP 21383002, filed Nov. 5, 2021, the contents of which is incorporated herein by reference in its entirety.

FIELD

The present invention relates to a vehicle trim panel having a switching function comprising a decorative front panel which conceals a switching device having switching areas defined on the decorative front panel for controlling vehicle functions and a lighting device for backlighting said switching areas. Particularly the switching device comprises capacitive sensors.

BACKGROUND

It is increasingly common to find proximity switches for controlling vehicle functions, such as the air conditioning system or the like, replacing conventional mechanical switches.

Proximity switches are proximity sensitive, that is they do not require mechanical movement. Therefore, the mere act of touching a switching area which function as touch sensor, effects the switch operation of the corresponding function associated to said switching area.

Due to the fact that the proximity switches do not require mechanical movement, they occupy a reduced space and they are easily integrated into vehicle trims. Thus, the decorative front panel forming the external surface of the vehicle trim conceals the switching device and at the same time acts as an actuating surface by the different switching areas defined on it.

This allows providing a continuous external surface which improves its appearance. In addition, it offers the vehicle occupant a more pleasant and harmonious environment inside the vehicle.

As a consequence of this, it is necessary to provide means for informing the vehicle occupant on the possibilities of interaction with the different switching areas.

One way to do this is to provide a lighting device concealed by the front decorative panel in order to backlight said switching areas.

For this, switching areas commonly comprise light transmitting portions forming pictograms which the vehicle occupant can identify and touch in order to control the corresponding vehicle function associated to the corresponding switching area.

In order to provide an individual illumination of each switching area, the lighting device can comprise a light guide structure having individual light guiding channels which allow independently lighting each switching area.

In order to ensure the individual illumination of each switching area is very important that the relative position between the light guide and the decorative front panel is ensured.

An example to illustrate the above configuration is the patent JP4218660.

On the other hand, one of the most widely used proximity switches in vehicles is based on capacitive sensing technology.

Said capacitive proximity switches comprise a plurality of antennas electrically connected to a corresponding capacitive sensor provided on a printed circuit board.

Each antenna forms a sensing area which detects the proximity of a human body part, such as a finger, by the corresponding switching area provided on the decorative front panel, and generates a signal due to a change in capacitance value which is transmitted to the corresponding capacitive sensor configured to perform the corresponding switching function.

In order to ensure a correct operation of the switching device according to this technology, it is very important that the antennas are correctly positioned with respect to the switching areas where the vehicle occupant acts.

This means that each antenna has enough sensitivity to provide the switching operation when the vehicle occupant touches the corresponding switching area and the different signals affecting the different antennas do not interfere between them.

With regard to the sensitivity of the antennas, both the centering and the proximity of the antennas avoiding the presence of air-gaps in relation to the corresponding switching area is important, the closer the antennas are to the switching areas configured in the decorative front panel, the better is the sensitivity of the antennas.

On the other hand, in order to simplify the assembly of several individual antennas on the vehicle trim affecting each of them to a corresponding switching area, they are commonly provided as conductive printed paths on a common film which in turn is connected to the printed circuit board comprising the capacitive sensors.

Patent KR101985374 discloses a vehicle trim panel having a switching function comprising a decorative front panel having several switching areas and a touch sensor film forming an integral part of the decorative front panel.

As the touch sensor film forms an integral part of the decorative front panel where the switching areas are defined, both the centering and the proximity of the antennas regarding the switching areas are ensured during its manufacturing process. Thus, a correct operation of the different switching areas in terms of sensitivity can be ensured.

A disadvantage of this configuration is derived from the difficulty or inability to separate the film and the decorative front panel.

On the one hand, during the service life of the vehicle trim, said limitation makes difficult to exchange or repair the film without damaging the decorative front panel.

On the other hand, at the end of the service life of the vehicle trim, said limitation makes difficult to recycle the decorative front panel due to the difficulty to separate both components.

In addition, the integration of the film with the vehicle front panel increases the complexity of its manufacturing process and it is detrimental to the standardization of components.

In order to overcome the above mentioned disadvantage, the film comprising the antennas could be provided as an independent component from the decorative front panel as for example JP4218660 discloses.

In this case, it arises several problems derived from the fact that the film is a flexible element not self-supporting difficult to handle.

On the one hand, since that each of the switching areas controls a particular vehicle function, in order to guarantee a correct operating of the switching device, it is very important to ensure the relative position of each individual antenna regarding both the corresponding switching area provided on the decorative front panel, and regarding the corresponding LED in charge of backlighting said switching area through said antenna.

On the other hand, in order not to penalize the sensitivity of the antennas, they have to be as closer as possible to the switching areas provided on the decorative front panel.

In view of the disadvantages mentioned above, the object of the invention is a vehicle trim panel having a switching function comprising a decorative front panel which conceals a switching device for controlling vehicle functions and a lighting device for backlighting the switching areas defined on the decorative front panel wherein the switching device comprises several antennas printed on a common sensor film ensuring the relative position of the antennas regarding the decorative front panel and regarding the lighting device, and ensuring a permanent contact free of air-gaps between the sensor film and the decorative front panel in order to maximize its sensitivity, being the film and the decorative front panel easily separable from each other.

SUMMARY

According to a first aspect of the invention, the decorative front panel conceals a switching device comprising switching areas defined on the decorative front panel for controlling different vehicle functions and a lighting device for backlighting the switching areas.

Thus, the vehicle trim provides a continuous external surface which improves its appearance, offering the vehicle occupant a more pleasant and harmonious environment inside the vehicle.

According to another aspect of the invention, the vehicle trim comprises a lighting device for individually illuminating each switching area. Thus, the vehicle occupant can interact with every single switching area in order to control the corresponding vehicle function associated to said switching area although the switching device is completely hidden by the front decorative panel.

According to another aspect, the switching device comprises several antennas provided on a common light transmitting film.

On the one hand it allows the light can be transmitted to the decorative front panel in order to backlight the switching areas although said film is provided between the lighting device and the decorative front panel.

On the other hand, since that the antennas are provided on a common film, it simplifies the assembly of several individual antennas on the vehicle trim.

Additionally, since all the connections affecting every antenna can be routed and grouped on a common tab provided as an extension of the film, the electrical connection between the antennas and the capacitive sensors provided on a printed circuit board is simplified as well.

According to another aspect of the invention, the sensor foil further comprises an elastic rubber-like portion configured to be compressed between the back side of the decorative front panel and the front side of the light guide in order to keep the sensor foil in tight contact free of air-gaps with the back side of the decorative front panel.

Particularly, said elastic rubber-like portion comprises first attaching means configured to tightly and removably fit the sensor foil due to the elasticity of the elastic rubber-like portion either to the light guide according to a first main embodiment of the invention or to the decorative front panel according to a second main embodiment of the invention.

On the one hand, the rubber-like portion allows reinforcing the sensor foil which makes easier its handling during the assembly process. In turn, said easy handling contributes to achieve an accurate assembly of the sensor foil.

On the other hand, the particular configuration of the first attaching means allowing a press fitting type attachment due to the elasticity of the material they are formed, makes possible a quick and removable assembly process of the sensor foil.

Thus, the sensor foil can be easily exchanged or repaired during the service life of the vehicle trim without damaging any component forming the assembly, and at the end of the service life of the vehicle trim, it improves the recycling of the whole assembly.

On the other hand, this type of attachment avoids using adhesive as attaching means simplifying the tooling used during the assembly process of the whole assembly and avoiding the scrap produced due to errors during the gluing step.

In addition, as the sensor foil is a separable part regarding the decorative front panel, the manufacturing process of the decorative front panel is simplified, and the standardization of the sensor foil for different decorative front panel finishes, especially in the case in which the light transmitting film forms an integral part of the decorative front panel, is possible.

On the other hand, the particular configuration of the attaching means together with the easy handling of the sensor foil, allow an accurate assembly of the sensor foil either regarding the light guide according to a first main embodiment or regarding the decorative front panel according to a second main embodiment.

Thus, according to the first main embodiment, it is directly ensured the relative position between the sensing areas provided on the light transmitting film, including the printed antennas and the second light transmitting portions, and the corresponding light guiding channels, which makes it possible to ensure the individual illumination through each sensing area.

According to the second main embodiment, it is directly ensured the relative position between the sensing areas provided on the light transmitting film and the switching areas provided on the decorative front panel, which makes it possible to center the position of each antenna regarding the corresponding switching area which favours the sensitivity of each antenna.

According to another aspect of the invention, the elastic rubber-like portion is compressed between the back side of the decorative front panel and the front side of the light guide. Thus, a tight contact free of air-gaps between the sensor foil and the back side of the decorative front panel is ensured even according to the first main embodiment wherein the decorative front panel and the sensor foil are not connected by any attaching means.

As the closer the film is to the switching areas configured in the decorative front panel the better is the sensitivity of the antennas, said tight contact free of air-gaps between both components allows maximizing said sensitivity and in this way ensuring the correct operating of the switching device.

DESCRIPTION OF THE FIGURES

The present descriptive memory is completed by a set of figures illustrating the preferred embodiment and in no way limiting the invention.

DETAILED DESCRIPTION

Figure 1:
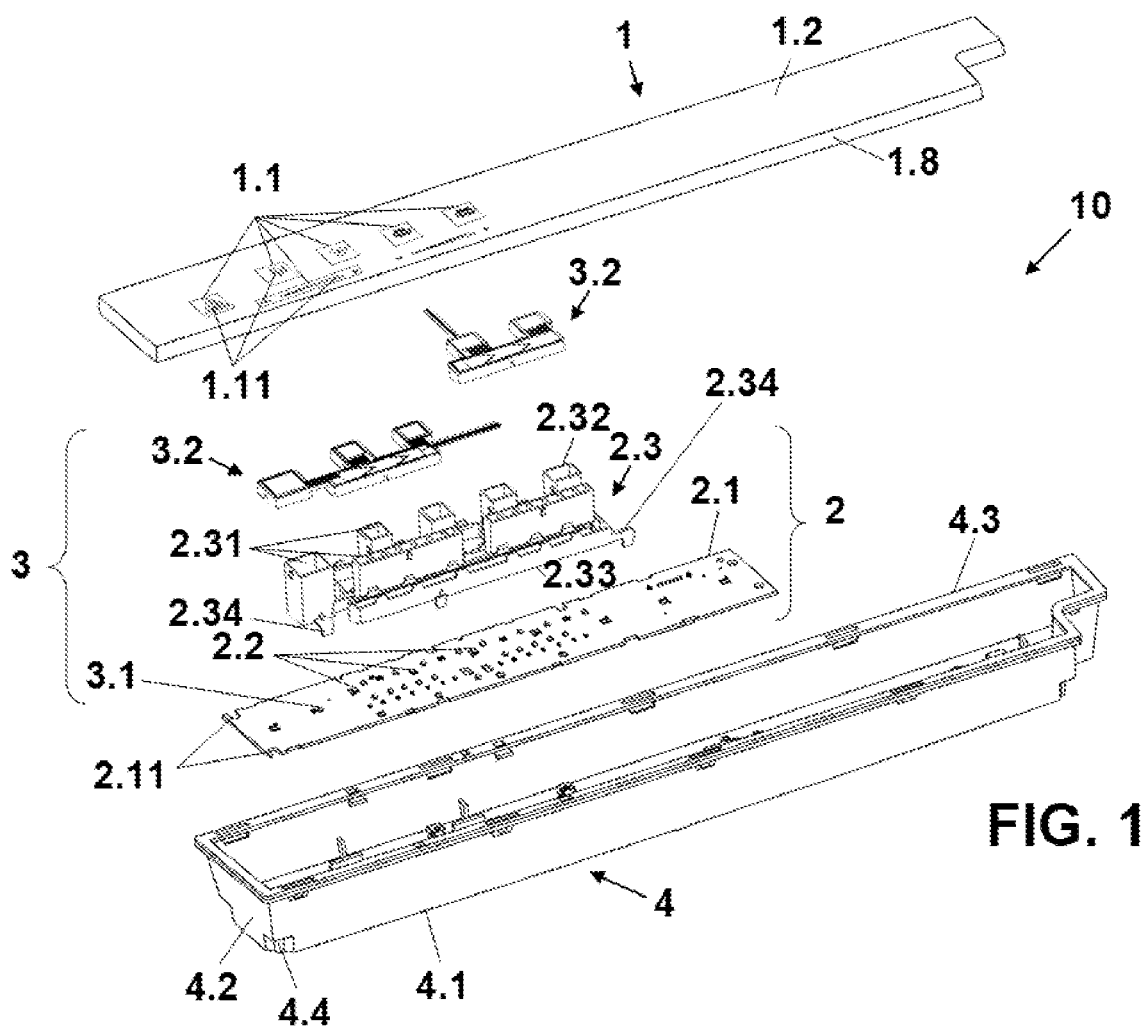
FIG. 1 shows an exploded view of a vehicle trim panel according to a first main embodiment of the invention.

FIG. 1 shows an exploded view of the vehicle trim panel (10) having a switching function wherein the main parts forming the whole assembly can be distinguished, namely a decorative front panel (1), a lighting device (2) and a switching device (3).

The decorative front panel (1) conceals the other parts forming the assembly. Thus, when the vehicle trim panel (10) is mounted in the vehicle, the vehicle occupant only can see the decorative front panel (1).

The decorative front panel (1) comprises several switching areas (1.1), represented in FIG. 1 as windows delimited by dotted lines, through which the vehicle occupant can interact in order to control the particular vehicle function associated to each switching area (1.1).

Every switching area (1.1) comprises a first light transmitting portion (1.11) defining a pictogram. The pictogram can be any figurative or symbolic drawing used for communication purposes, including alphanumeric characters. The first light transmitting portions (1.11) are positioned according to positions well-defined during the manufacturing process of the decorative front panel (1).

The decorative front panel (1) has a front side (1.2) facing the vehicle interior cabin VC, and a back side (1.3), opposite to the front side (1.2).

It can comprise a light transmitting support (1.5) made of a transparent plastic material such as polycarbonate or Polymethyl methacrylate, which forms the main body of the decorative front panel (1) and provides the particular shape thereof.

It further comprises a mask (1.6) which has light transmitting portions (1.61) according to the shape of the pictograms, and opaque portions (1.62).

The decorative front panel (1) can further comprise a decorative film (1.7) mainly translucent which provides a decorative effect to the vehicle front panel (1) such as woody effect, a metallic effect or other decorative effects.

Figure 7:
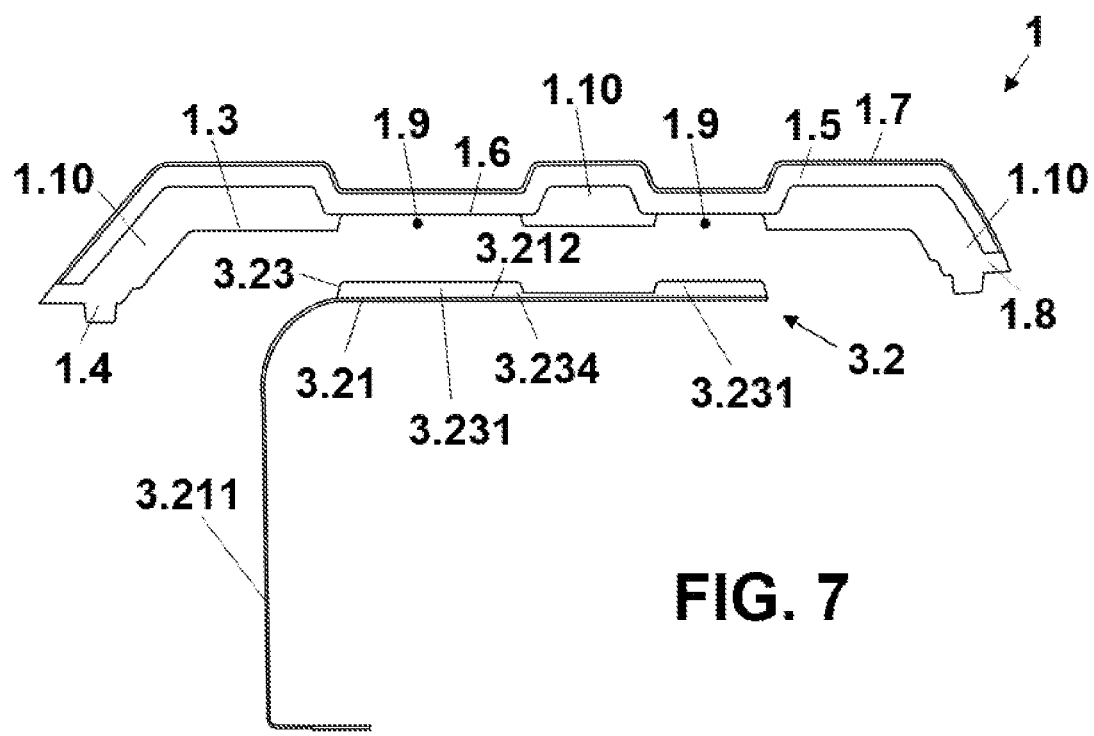
FIG. 7 shows an exploded view of the decorative front panel and the sensor foil according to a second main embodiment of the invention.

The decorative front panel (1) further can comprise second attachment means (1.4) configured to connect it to the rest of the components forming the vehicle trim panel (1). As the particular configuration represented in the FIGS. 5 and 7 show, the second attachment means (1.4) provides a connection between the front decorative panel (1) and a back housing (4) described in detail below.

Figure 5:
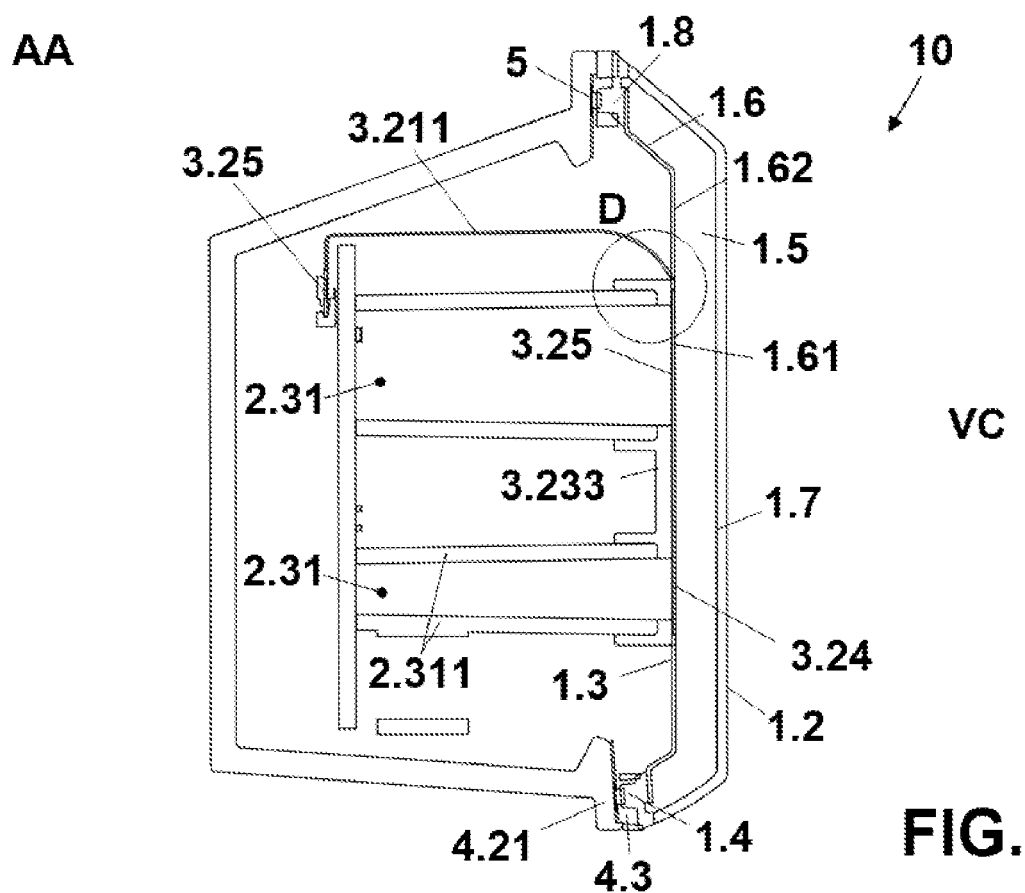
FIG. 5 shows a cross-sectional view according to the plane AA represented in the FIG. 4 of the vehicle trim panel according to a first main embodiment of the invention.

As FIG. 5 shows the second attachment means (1.4) can comprise clips distributed around an edge (1.8) of the decorative front panel (1). Said edge (1.8) preferably comprises an opaque material in order to prevent light leakages outside the vehicle trim panel (10). Additionally, the second attachment means (1.4) can be configured as a prolongation of said opaque edge (1.8).

The decorative front panel (1) can be manufactured for example by an injection molding process.

The second main part forming the vehicle trim part (10) is the lighting device (2). It illuminates the pictograms through the first light transmitting portions (1.11) in order to inform the vehicle occupant on the possibilities of interaction with the individual switching areas (1.1).

The lighting device (2) comprises in turn a printed circuit board (2.1) having several LEDs (2.2) configured each of them to illuminate a corresponding switching area (1.1). The LEDs (2.2) are positioned on a printed circuit board (2.1) according to positions well-defined during the manufacturing process of the printed circuit board (2.1).

In addition, the printed circuit board (2.1) can comprise forth attachment means (2.11) in order to attach the printed circuit board (2.1) to a back housing (4) described in detail below, or to other vehicle component or other vehicle trim panel component which allows supporting the whole assembly.

In order to ensure an individual illumination of each switching area (1.1), the lighting device (2) further comprises a light guide (2.3) defining individual light guiding channels (2.31) which allow independently lighting each switching area (1.1).

The light guiding channels (2.31) comprise peripheral walls (2.311) which extend perpendicularly to the printed circuit board (2.1) delimiting said light guiding channels (2.31). The inner side of the peripheral walls (2.311) acts as a reflector guiding the light from each corresponding LED (2.2) to the corresponding sensing area (3.22) provided in the sensor foil (3.2) described below which in turn, is in correspondence with a switching area (1.1) provided in the decorative front panel (1).

Therefore, every light guiding channel (2.31) is in correspondence with a LED (2.2) at a first end (2.312), and in correspondence with a sensing area (3.22) at a second end (2.313).

Figure 3:
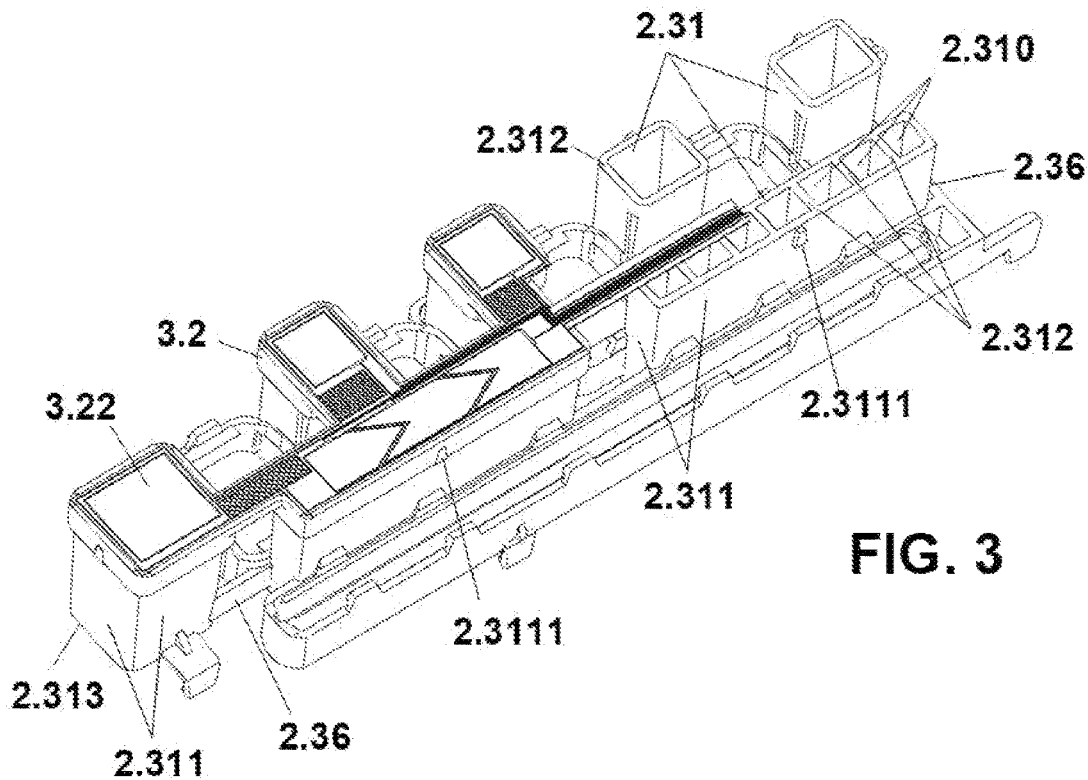
FIG. 3 shows a perspective view of a sensor foil mounted on a light guide according to a first main embodiment of the invention.
Figure 4:
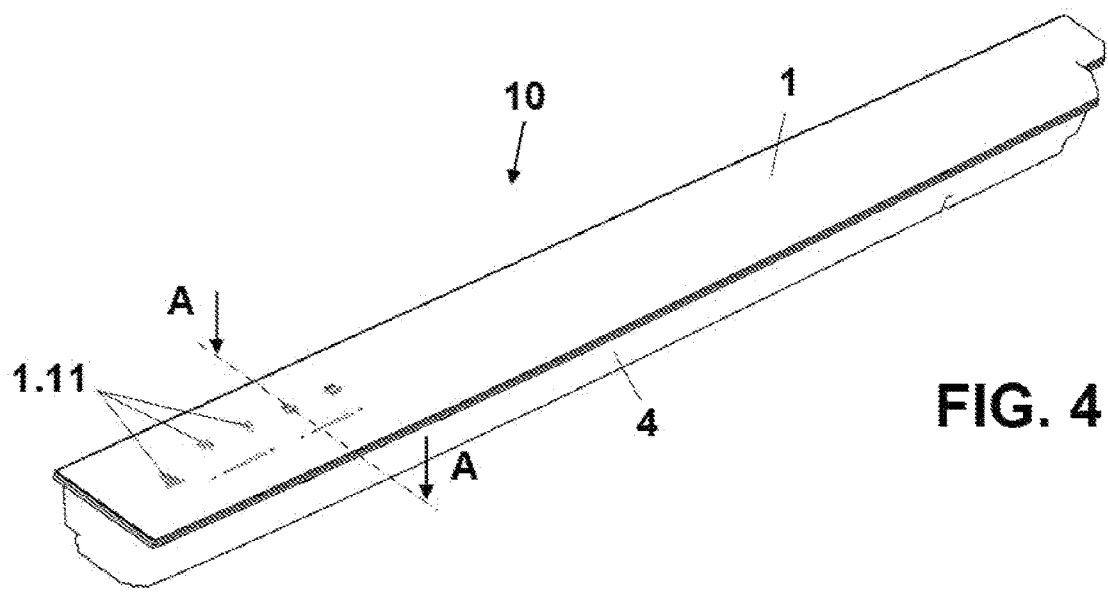
FIG. 4 shows a perspective view of a vehicle trim panel according to either of the two main embodiments.

In addition, a light guiding channel (2.31) in turn can be divided into sub-channels (2.310). In this case, the particular light guiding channel (2.31) in addition to having the peripheral walls (2.311) delimiting its outer contour, it also comprises dividing walls (2.312) defining the sub-channels (2.310) as FIG. 3 shows. According to this particular case, each sub-channel (2.310) is in correspondence with a corresponding LED (2.2).

This particular case, can be appropriate to define capacitive proximity switches activated by a sliding movement.

According to a configuration represented in the FIG. 1, the light guiding channels (2.31) forming the light guide (2.3) can be connected between them by first bridges (2.36), in order to configure the light guide (2.3) as a single part.

The particular structure of the light guide (2.3) will depend on the particular distribution of the switching areas (1.1) over the decorative front panel (1) and their particular working.

The light guide (2.3) has a front side (2.32) facing the decorative front panel (1) and a back side (2.33) facing the printed circuit board (2.1).

In addition, the light guide (2.3) can comprise third attachment means (2.34) in order to attach the light guide (2.3) to the printed circuit board (2.1).

As FIG. 1 shows, said third attachment means (2.34) can comprise clips.

The light guide (2.3) can comprise a plastic part manufactured for example by an injection molding process.

Finally, the last part forming the assembly is the switching device (3).

It comprises several capacitive sensors (3.1), each of them affecting a particular switching area (1.1) provided in the decorative front panel (1). They can be provided in the same printed circuit board (2.1) as the LEDs (2.2) or in a further printed circuit board.

The switching device (3) also comprises a sensor foil (3.2) having several independent sensing areas (3.22) configured on a light transmitting film (3.21).

Each sensing area (3.22) comprises in turn, a printed antenna (3.221) on the light transmitting film (3.21) and electrically connected to a corresponding capacitive sensor (3.1), and a second light transmitting portion (3.222) formed by a portion of said light transmitting film (3.21).

In order to connect the printed antennas (3.221) to the capacitive sensors (3.1) the light transmitting film (3.21) can comprise a tab (3.211) which receives the different electrical tracks (3.223) connected to the printed antennas (3.221).

As FIG. 5 shows, the free end (3.2111) of the tab (3.211) can comprise a plastic connector (3.25) part in order to provide both the electrical and the mechanical connection with the printed circuit board comprising the capacitive sensors (3.1).

According to an embodiment, the printed antennas (3.221) are arranged surrounding the corresponding sensing area (3.22) in such a way that they enclose the second light transmitting portions (3.222). Thus, the light can pass through the sensing areas (3.22) even if the material forming the printed antennas (3.221) is opaque.

The material forming the printed antennas (3.221) can be any conductive printable material such as a conductive ink. The conductive ink can be opaque or transparent.

The material forming the light transmitting film (3.21) can be a plastic material such as polyethylene terephthalate (PET) or polyethylene (PE).

According to an optional configuration, the light transmitting film (3.21) is milky white in order to diffuse the light passing through it. Thus, the light homogenization is improved.

The light transmitting film (3.21) has a front side (3.212) facing the back side (1.3) of the front decorative panel (1) and a back side (3.213) facing the front side (2.33) of the light guide (3.2).

The sensor foil (3.2) further comprises an elastic rubber-like portion (3.23) configured to be compressed between the back side (1.3) of the decorative front panel (1) and the front side (2.32) of the light guide (2.3) in the mounting position in order to keep the sensor foil (3.2) in tight contact free of air-gaps with the back side (1.3) of the decorative front panel (1).

Thus, the compression of the elastic rubber-like portion (3.23) when the sensor foil (3.2) is assembled, is only intended to keep the sensor foil (3.2) in tight contact free of air-gaps with the decorative front panel (1), which means that said elastic rubber-like portion (3.23) does not have to compress when the vehicle occupant touches or presses the decorative panel (1) to activate the switching device (3).

In addition, said elastic rubber-like portion (3.23) comprises first attaching means (3.231) configured to tightly and removably attach the sensor foil (3.2), due to the elasticity of the elastic rubber-like portion material, to either the light guide (2.3) or to the decorative front panel (1).

Figure 8:
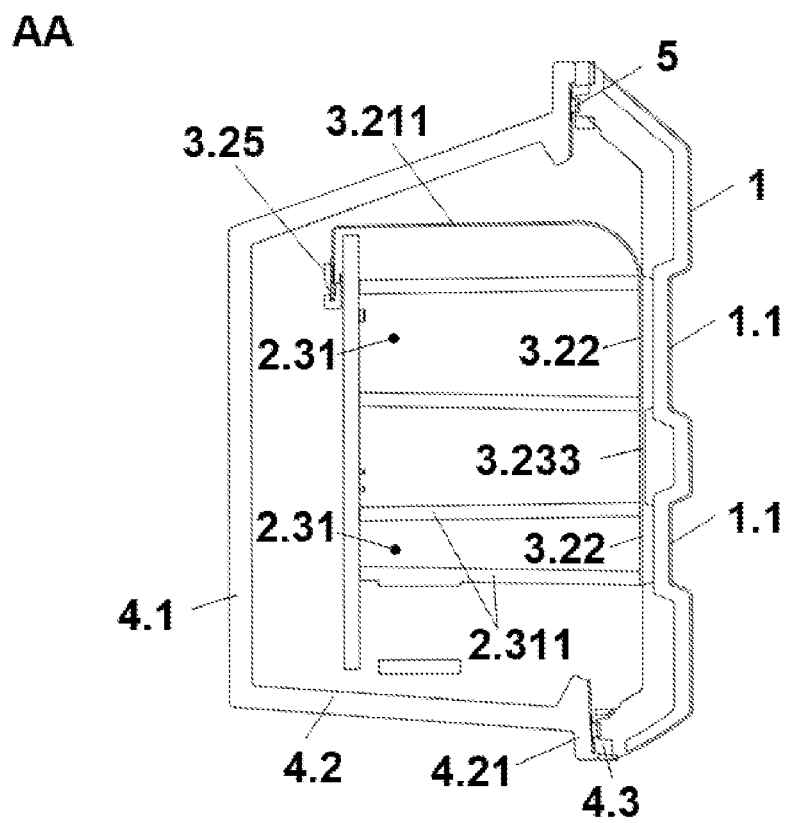
FIG. 8 shows a cross-sectional view according to the plane AA represented in the FIG. 4 of the vehicle trim panel according to a second main embodiment of the invention.

Thus, according to the particular configuration of the elastic rubber-like portion (3.23), the present invention defines two main embodiments, a first main embodiment represented in FIGS. 1, 2, 3, 5 and 6, in which the elastic rubber-like portion (3.23) is at the back side (3.213) of the light transmitting film (3.21) and the sensor foil (3.2) comprising said elastic rubber-like portion (3.23) is assembled on the light guide (2.3) and a second main embodiment represented in FIGS. 7, and 8, in which the elastic rubber-like portion (3.23) is at the front side (3.212) of the light transmitting film (3.21) and the sensor foil (3.2) comprising said elastic rubber-like portion (3.23) is assembled on the decorative front panel (1).

Figure 2:
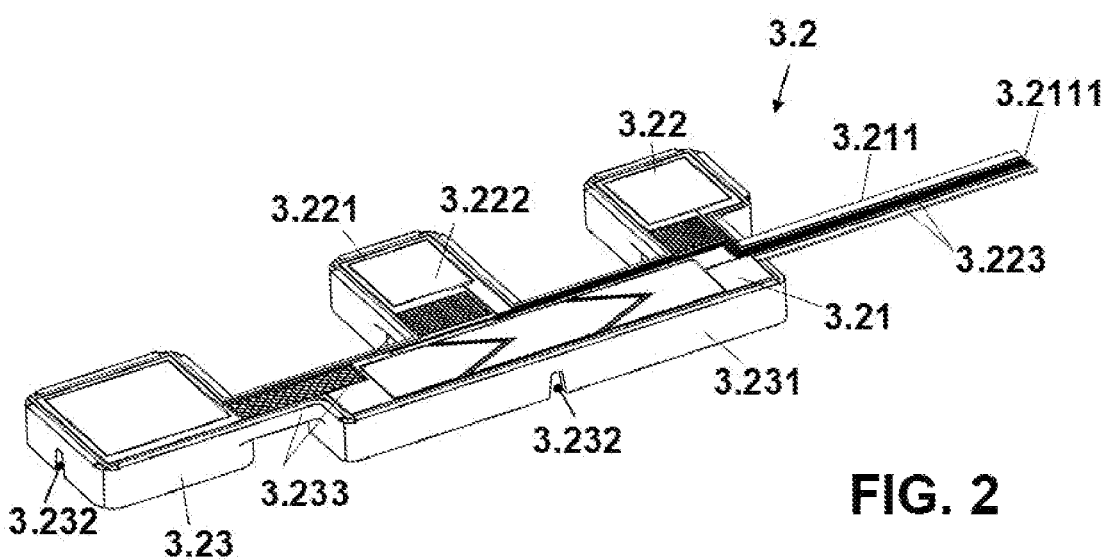
FIG. 2 shows a perspective view of a sensor foil according to a first main embodiment of the invention.

The elastic rubber-like portion (3.23) and the light transmitting film (3.21) can be configured by over-moulding, or can be connected by any other attaching means such as an adhesive. In any case, both components configure a single part as FIG. 2 or 7 show, namely the sensor foil (3.2), which acts as a single part during the assembly process of the vehicle trim part (10) of the invention.

The material forming the elastic rubber-like portion (3.23) can be silicone rubber.

The main functions of the elastic rubber-like portion (3.23) in both embodiments are the same, namely it makes easier the handling of the sensor foil (3.2) during the assembly process, thereby contributing to achieve an accurate assembly of the sensor foil (3.2) in which the relative position of each sensing area (3.22) regarding either the corresponding light guiding channel (2.31) in the case of the first main embodiment or the corresponding switching area (1.1) in the case of the second main embodiment, is directly ensured.

In addition, it provides a press fitting type attachment due to the elasticity of the material of the elastic rubber-like portion (3.23), thereby making possible a quick and removable assembly process of the sensor foil (3.2) avoiding the use of adhesives.

In addition, it allows a tight contact free of air-gaps of the sensor foil (3.2) with the back side (1.3) of the decorative front panel (1) thereby improving the sensitivity of the sensing areas (3.22).

Before describing the particular details pertaining to each of the main embodiments and for the sake of clarity, it is necessary to mention that, the above described features in the description are common to both main embodiments.

According to the first main embodiment the elastic rubber-like portion (3.23) is at the back side (3.213) of the light transmitting film (3.21) and the sensor foil (3.2) comprising said elastic rubber-like portion (3.23) is assembled on the light guide (2.3).

Particularly, in this case the elastic rubber-like portion (3.23) is made of an opaque material and it comprises a strip having a shape according to the outline of the light guide (2.3) in order to tightly attach the sensor foil (3.2) to the light guide (2.3). Said strip, configures the first attaching means (3.231).

The outline of the light guide (2.3) is defined as the outer contour forming the light guide (2.3) and particularly, the peripheral walls (2.311) forming the light guiding channels (2.31). It means that the dividing walls (2.312) forming the sub-channels (2.310), if any, do not form part of the outline of the light guide (2.3). That is, the elastic rubber-like portion (3.23) by the first attaching means (3.231), is adapted to the outer contour forming the light guide (2.3) as FIG. 3 shows.

Due to the elasticity of the strip and its particular shape according to the outline of the light guide (2.3), it adapts and fits to the light guide (2.3) in such a way that it establishes a tight connection between both parts.

Thus, the collaboration between both parts provides a press fitting type attachment due to the elasticity of the material of the elastic rubber-like portion (3.23) in which the strip is deformed and compressed against the outline forming the light guide (2.3).

In addition, this tight connection between both parts together with the fact that the elastic rubber-like portion (3.23) is opaque, allows that the perimeter of the light guide (2.3) is completely sealed thereby preventing light leakages outside the light guide (2.3).

Figure 6:
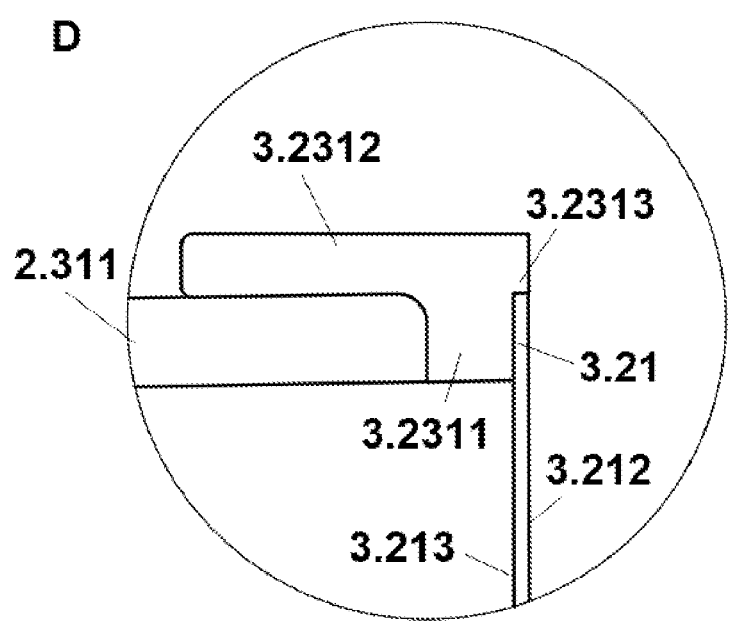
FIG. 6 shows a detail view of the sensor foil corresponding to the detail D represented in the FIG. 5.

According to a particular configuration within this first main embodiment represented in the FIG. 6, the strip comprises a base portion (3.2311) contacting the front side (2.33) of the light guide (2.3) and the back side (3.213) of the light transmitting film (3.21) and a wing (3.2312) extended downwards and perpendicularly to the base portion (3.2311), in the direction of the peripheral walls (2.311). Said wing (3.2312) being adjusted to the peripheral walls (2.311) forming the outline of the light guide (2.3)

According to other advantageous configuration represented in the FIG. 6, the strip further can comprise a light leakage prevention portion (3.2313) extended upwards and perpendicularly to the base portion (3.2311) as a prolongation of the wing (3.2312), wherein said light leakage prevention portion (3.2313) surrounds the edge of the light transmitting film (3.21). In this way any possible light leakage occurring by the edge of the light transmitting film (3.21) is also prevented.

According to other advantageous configuration, the strip further comprises centering means which makes even easier the assembly of the sensor foil (3.2) in the light guide (2.3) according to the correct position of the sensing areas (3.22).

As FIGS. 2 and 3 show, the centering means can comprise an opening (3.232) provided in the strip, fitting a corresponding nose (2.3111) provided in a peripheral wall (2.311) forming the outline of the light guide (2.3). Preferably, each light guiding channel (2.31) comprises at least a nose (2.3111) and the strip comprises the corresponding opening (3.232) for configuring the centering means.

Additionally, the elastic rubber-like portion (3.24) as FIG. 5 shows, can comprise second bridges (3.233) connecting portions of the strip which affect to different light guiding channels (2.31) in order to configure the elastic rubber-like portion (3.24) as a single part.

As disclosed above, according to the second main embodiment the elastic rubber-like portion (3.23) is at the front side (3.212) of the light transmitting film (3.21) and the sensor foil (3.2) comprising said elastic rubber-like portion (3.2) is assembled on the decorative front panel (1), particularly at its back side (1.3).

Particularly in this case, the elastic rubber-like portion (3.23) is made of a light transmitting material and it comprises a main base (3.234) extended over the front side (3.212) of the light transmitting film (3.21) and several light transmitting protuberances (3.231), which form the first attaching means (3.231) in this case, emerging from said main base (3.234) and being in correspondence with the sensing areas (3.22). The light transmitting protuberances (3.231) collaborate with a corresponding attaching window (1.9) provided at the back side (1.3) of the decorative front panel (1) in order to attach the sensor foil (3.2) to the decorative front panel (1).

Particularly, the attaching windows (1.9) are configured according to the shape of said light transmitting protuberances (3.231) in order to tightly attach the sensor foil (3.2) to the decorative front panel (1), that is, the collaboration between the attaching windows (1.9) and the light transmitting protuberances (3.231) provides a press fitting type attachment due to the elasticity of the material of the elastic rubber-like portion (3.23). Therefore, each light transmitting protuberance (3.231) is deformed and compressed within the cavity formed by the corresponding attaching window (1.9).

As each light transmitting protuberance (3.231) is configured as an elevation to the vehicle interior cabin VC in relation to each sensing area (3.22), they allow the light passage from the light guiding channels (2.31) to the vehicle interior cabin VC through the decorative front panel (1).

In order to improve the homogeneity of the light, the light transmitting material forming the protuberances (3.231) can comprise additives that diffuse the light.

As in the first main embodiment, the elastic rubber-like portion (3.24) as FIG. 8 shows, can comprise second bridges (3.233) connecting portions of the elastic rubber-like portion (3.24) which affect to different light guiding channels (2.31) in order to configure the elastic rubber-like portion (3.24) as a single part.

As it has been described above, the attaching windows (1.9) are configured at the back side (1.3) of the decorative front panel (1).

As in the first main embodiment, according to this second main embodiment, the decorative front panel (1) can comprise a light transmitting support (1.5) made of a transparent plastic material such as polycarbonate or Polymethyl methacrylate, which forms the main body of the decorative front panel (1) and provides the particular shape thereof and a mask (1.6) which defines the pictograms.

Preferably as FIG. 8 shows, the attaching windows (1.9) are provided at the back side of the light transmitting support (1.5). Preferably, they are formed as empty spaces provided in an opaque layer (1.10) configured at the back side of the light transmitting support (1.5).

As in the first main embodiment, the decorative front panel (1) can further comprise a decorative film (1.7) mainly translucent which provides a decorative effect to the vehicle front panel (1) such as woody effect, a metallic effect or other decorative effects.

As in the first main embodiment, the decorative front panel (1) further can comprise second attachment means (1.4) configured to connect it to the rest of the components forming the vehicle trim panel (1). As FIG. 8 shows the second attachment means (1.4) can comprise clips distributed around an edge (1.8) of the decorative front panel (1). Said edge (1.8) preferably comprises an opaque material in order to prevent light leakages outside the vehicle trim panel (10). Additionally, the second attachment means (1.4) can be configured as a prolongation of said opaque edge (1.8).

The front side (1.2) of the decorative front panel (1) can be a continuous surface or as FIGS. 7 and 8 show, it can comprise recessed areas in correspondence with the switching areas (1.1)

According to the particular configuration of the different parts above described, each switching area (1.1) is associated to the corresponding sensing area (3.22), the corresponding light guiding channel (2.31), the corresponding LED (2.2) and the corresponding capacitive sensor (3.1).

Thus, the different switching areas (1.1) provided on the decorative front panel (1) can be firstly identified by the vehicle occupant and secondly they can be individually actuated in order to control the corresponding vehicle function associated to the corresponding switching area (1.1).

According to a configuration common to both the first main embodiment and the second main embodiment, the vehicle trim panel (10) further comprises a back housing (4) as for example FIGS. 5 and 8 show.

It encapsulates and protects the whole assembly forming an enclosed space with the decorative front panel (1).

The back housing (4) can comprise a base (4.1) and a peripheral wing (4.2) extended upwards the base (4.1).

The peripheral wing (4.2) can comprise a supporting area (4.21) wherein an elastic sealing ring (4.3) rests in order to seal the whole assembly against dust and moisture.

Said back housing (4) can comprise fifth attachment means (4.4) in order to attach the vehicle trim panel (1) to the vehicle.

According to another particular embodiment common to the first and the second main embodiments, the elastic sealing ring (4.3) can comprise several force sensors (5) distributed along it and electrically connected to the capacitive sensors (3.1), for activating the switching device and in this way avoiding unintentional activation of the capacitive sensors (3.1).

The invention claimed is:

1. Vehicle trim panel (10) having a switching function comprising:
 a decorative front panel (1) comprising several switching areas (1.1) comprising each of them a first light transmitting portion (1.11) defining a pictogram, the decorative front panel (1) having a front side (1.2) and a back side (1.3),
 a lighting device (2) comprising:
  a printed circuit board (2.1) having several LEDs (2.2),
  a light guide (2.3) defining individual light guiding channels (2.31) comprising peripheral walls (2.311) extended perpendicularly to the printed circuit board (2.1), the light guide (2.3) having a front side (2.32) facing the decorative front panel (1) and a back side (2.33) facing the printed circuit board (2.1),
 a switching device (3) comprising:
  several capacitive sensors (3.1),
  a sensor foil (3.2) comprising:
   a light transmitting film (3.21) having a front side (3.212) facing the back side (1.3) of the front decorative panel (1) and a back side (3.213) facing the front side (2.32) of the light guide (2.3), and
   several independent sensing areas (3.22) configured on the light transmitting film (3.21) comprising each of them:
    a printed antenna (3.221) on the light transmitting film (3.21) and electrically connected to a corresponding capacitive sensor (3.1),
    a second light transmitting portion (3.222) formed by a portion of said light transmitting film (3.21),
 wherein each switching area (1.1) is associated to a corresponding sensing area (3.22), a corresponding light guiding channel (2.31), a corresponding LED (2.2) and a corresponding capacitive sensor (3.1),
characterized in that,
 the sensor foil (3.2) further comprises an elastic rubber-like portion (3.23) configured to be compressed between the back side (1.3) of the decorative front panel (1) and the front side (2.32) of the light guide (2.3) in order to keep the sensor foil (3.2) in tight contact free of air-gaps with the back side (1.3) of the decorative front panel (1),
 said elastic rubber-like portion (3.23) comprises first attaching means (3.231) configured to tightly and removably attach the sensor foil (3.2), due to an elasticity of the elastic rubber-like portion (3.23), to either the light guide (2.3) or to the decorative front panel (1).

2. Vehicle trim panel (10) having a switching function according to claim 1, wherein the elastic rubber-like portion (3.23) is opaque and it comprises a strip having a shape according to the outline of the light guide (2.3) in order to tightly attach the sensor foil (3.2) to the light guide (2.3) and wherein said strip comprises the first attaching means (3.231).

3. Vehicle trim panel (10) having a switching function according to claim 2, wherein the strip comprises a base portion (3.2311) contacting the front side (2.33) of the light guide (2.3) and the back side (3.213) of the light transmitting film (3.21) and a wing (3.2312) extended downwards and perpendicularly to the base portion (3.2311) which is adjusted to the peripheral walls (2.311) forming the outline of the light guide (2.3).

4. Vehicle trim panel (10) having a switching function according to claim 3, wherein the elastic rubber-like portion comprises a light leakage prevention portion (3.2313) extended upwards and perpendicularly to the base portion (3.2311) as a prolongation of the wing (3.2312), wherein said light leakage prevention portion (3.2313) surrounds an edge of the light transmitting film (3.21).

5. Vehicle trim panel (10) having a switching function according to claim 3, wherein the elastic rubber-like portion comprises centering means for positioning the light transmitting film regarding the light guide.

6. Vehicle trim panel (10) having a switching function according to claim 5, wherein the centering means comprise an opening (3.232) provided in the strip, fitting a corresponding nose (2.3111) provided in the peripheral wall (2.311) forming the outline of the light guide (2.3).

7. Vehicle trim panel (10) having a switching function according to claim 1, wherein the elastic rubber-like portion (3.23) is made of a light transmitting material and it comprises a main base (3.234) extended over the front side (3.212) of the light transmitting film (3.21) and several light transmitting protuberances, which form the first attaching means (3.231), wherein the light transmitting protuberances emerge from said main base (3.234) and wherein each light transmitting protuberance (3.231) is in correspondence with each sensing area (3.22) and wherein each light transmitting protuberance (3.231) collaborates with a corresponding attaching window (1.9) provided at the back side (1.3) of the decorative front panel (1) in order to attach the sensor foil (3.2) to the decorative front panel (1).

8. Vehicle trim panel (10) having a switching function according to claim 7, wherein the light transmitting material forming the protuberances (3.231) comprise additives that diffuse the light.

9. Vehicle trim panel (10) having a switching function according to claim 1 wherein the decorative front panel (1) comprises a light transmitting support (1.5) and a mask (1.6) defining the pictograms.

10. Vehicle trim panel (10) having a switching function according to claim 7 wherein the decorative front panel (1) comprises a light transmitting support (1.5) and a mask (1.6) defining the pictograms.

11. Vehicle trim panel (10) having a switching function according to claim 10, the attaching windows (1.9) are formed as empty spaces provided in an opaque layer (1.10) configured at a back side of the light transmitting support (1.5).

12. Vehicle trim panel (10) having a switching function according to claim 1 wherein the vehicle trim panel further comprises a back housing (4) supporting the whole assembly.

13. Vehicle trim panel (10) having a switching function according to claim 1 wherein light transmitting film is milky white in order to improve the light homogenization.

14. Vehicle trim panel (10) having a switching function according to claim 1 wherein each of the printed antennas (3.221) are provided surrounding the corresponding sensing area (3.22).

15. Vehicle trim panel (10) having a switching function according to claim 1 wherein the elastic rubber-like portion (3.23) and the light transmitting film (3.21) form an integral part configured by over-moulding.

* * * * *

UNITED STATES PATENT AND TRADEMARK OFFICE
CERTIFICATE OF CORRECTION

| | | |
|---|---|---|
| PATENT NO. | : 12,291,146 B2 | Page 1 of 1 |
| APPLICATION NO. | : 17/895930 | |
| DATED | : May 6, 2025 | |
| INVENTOR(S) | : Rodrigo Domingo De La Torre Martin et al. | |

It is certified that error appears in the above-identified patent and that said Letters Patent is hereby corrected as shown below:

On the Title Page

Column 1, (65) Prior Publication Data, Line 1, After "2023", insert --¶(30) Foreign Application Priority Data Nov. 5, 2021 (EP) 21383002--

Signed and Sealed this
Twelfth Day of August, 2025

Coke Morgan Stewart
*Acting Director of the United States Patent and Trademark Office*